US007154795B2

(12) United States Patent
Parris et al.

(10) Patent No.: US 7,154,795 B2
(45) Date of Patent: Dec. 26, 2006

(54) CLOCK SIGNAL INITIATED PRECHARGE TECHNIQUE FOR ACTIVE MEMORY SUBARRAYS IN DYNAMIC RANDOM ACCESS MEMORY (DRAM) DEVICES AND OTHER INTEGRATED CIRCUIT DEVICES INCORPORATING EMBEDDED DRAM

(75) Inventors: Michael C. Parris, Colorado Springs, CO (US); Kim C. Hardee, Colorado Springs, CO (US)

(73) Assignees: United Memories, Inc., Colorado Springs, CO (US); Sony Corporation, Tokyo (JP)

( * ) Notice: Subject to any disclaimer, the term of this patent is extended or adjusted under 35 U.S.C. 154(b) by 140 days.

(21) Appl. No.: 10/903,815

(22) Filed: Jul. 30, 2004

(65) Prior Publication Data

US 2006/0023530 A1 Feb. 2, 2006

(51) Int. Cl.
*G11C 7/00* (2006.01)
*G11C 8/00* (2006.01)
(52) U.S. Cl. .............. 365/203; 365/233; 365/230.03
(58) Field of Classification Search ........ 365/203, 365/233, 230.06, 230.03, 233.5
See application file for complete search history.

(56) References Cited

U.S. PATENT DOCUMENTS 5,384,745 A * 1/1995 Konishi et al. ........ 365/230.03
5,887,272 A * 3/1999 Sartore et al. ............ 711/105
5,943,290 A * 8/1999 Robinson et al. ........... 365/233
5,963,497 A * 10/1999 Holland ...................... 365/222
6,222,786 B1 * 4/2001 Holland et al. ............. 365/222
6,288,959 B1 * 9/2001 OuYang et al. ............. 365/203
6,510,091 B1 * 1/2003 Braceras et al. ............ 365/203
6,597,201 B1 * 7/2003 Parris et al. ................. 326/93
6,995,596 B1 * 2/2006 Yau ........................... 327/263

* cited by examiner

*Primary Examiner*—Amir Zarabian
*Assistant Examiner*—Michael Weinberg
(74) *Attorney, Agent, or Firm*—William J. Kubida; Peter J. Meza; Hogan & Hartson LLP

(57) ABSTRACT

A precharge initiated dynamic random access memory (DRAM) technique of especial utility with respect to DRAM devices and other integrated circuit devices incorporating embedded DRAM in which the rising edge of each clock initiates a precharge to those subarrays that were active as opposed to conventional techniques wherein the subarrays are typically precharged so that they are made ready on the rising edge of the clock, which would then start an active cycle. The longer restore time that is achieved can be used to enable the establishment of better logic "1" and "0" levels in the memory cells, to reduce the device clock period and/or to enable other functions to be performed in parallel with the precharge function.

20 Claims, 5 Drawing Sheets

CLOCK SIGNAL INITIATED PRECHARGE TECHNIQUE FOR ACTIVE MEMORY SUBARRAYS IN DYNAMIC RANDOM ACCESS MEMORY (DRAM) DEVICES AND OTHER INTEGRATED CIRCUIT DEVICES INCORPORATING EMBEDDED DRAM

BACKGROUND OF THE INVENTION

The present invention relates, in general, to the field of integrated circuit memory devices and devices incorporating embedded memory arrays. More particularly, the present invention relates to a clock signal initiated precharge technique for active memory subarrays in dynamic random access memory (DRAM) devices and other integrated circuit devices incorporating embedded DRAM.

It has long been a goal of memory design to increase the performance of DRAM in order to support higher speed processors. One method of increasing DRAM performance is to increase the "read" and "write" data rate across the memory bus. SDRAM access times and burst data rates are constantly improving by manufacturing process "shrinks" and improved interconnect technology. Additionally, improved command bus utilization has been achieved by reducing the number of instructions needed to perform certain memory operations. In general, the fewer command cycles which are required for the execution of memory commands results in more bus cycles which are then available for memory data transfers.

To date, several approaches have been used to minimize the number of command cycles needed to access SDRAM devices and embedded arrays. One example is the use of "burst accesses" which utilize a single "read" or "write" command execution in order to read or write to multiple sequential words. Another technique for reducing the number of command cycles required to access SDRAMs is the use of an "auto-precharge" mode of operation. Auto-precharge is a programmable mode wherein a "precharge" operation automatically occurs at the end of a predetermined number of burst "read" or "write" cycles without requiring the assertion of an external "precharge" command. Similarly, the execution of a "refresh" command in SDRAMs results in the device automatically precharging at the end of the "refresh" operation.

U.S. Pat. No. 6,288,959 issued on Sep. 11, 2001 entitled "Controlling the Precharge Operation in a DRAM Array in a SRAM Interface" describes a technique wherein the precharge operation of a DRAM array in a non-multiplexed address interface is controlled so that the DRAM is precharged only if there is a change in the word line address in order to effectuate a power saving. However, the technique described employs an activity monitor circuit in series with the address path which appreciably slows down memory accesses. Moreover, the memory arrays can remain active for relatively long periods of time thereby dissipating leakage power.

U.S. Pat. No. 6,510,091 issued on Jan. 21, 2003 entitled "Dynamic Precharge Decode Scheme for Fast DRAM" describes a DRAM which includes first and second address generators, subarrays, an address decode path and a precharge activation path wherein the precharge activation path and the address decode path are matched and wherein the occurrence of an event during an active phase, for example a sense amplifier set signal initiation, initiates the precharge phase process. Through use of the technique described, address pre-decoding and precharging may be performed simultaneously, but the precharge operation starts at the end of the cycle.

Other approaches are described, for example, in U.S. Pat. No. 5,963,497 issued Oct. 5, 1999 for "Dynamic Random Access Memory System with Simultaneous Access and Refresh Operations and Method for Using the Same" and U.S. Pat. No. 6,222,786 issued Apr. 24, 2001 for "Dynamic Random Access Memory with Write-Without-Restore and Systems and Methods Using the Same".

SUMMARY OF THE INVENTION

In accordance with the technique of the present invention as disclosed herein, the rising edge of each clock initiates a precharge to those memory subarrays that were active. This differs from conventional approaches wherein the subarrays are typically precharged such that they are made ready on the rising edge of the clock, which would then start an active cycle. The longer restore time can be used to achieve the introduction of better logic "1" and "0" levels into the memory cell and/or to reduce the clock period.

The technique of the present invention provides a number of advantages over conventional techniques, among which are that: a) a timer may be used to determine the end of a precharge operation rather than the end of a cell restore function. The former is a shorter time period and, therefore, an easier timer function to implement; b) faster clock frequencies can be achieved; c) by starting each clock cycle with a precharge command, other functions can be performed in parallel with the precharge function (for example, address pre-decoding, data propagation for write functions and, in a particular embodiment of the present invention, the access to determine a cache "hit" or "miss". This parallel operation allows for less "dead" time and overall higher performance); and d) further, the amount of time used to restore voltage into the DRAM array memory cell can be changed with longer or shorter clock periods.

Particularly disclosed herein is a method for operation of an integrated circuit device including at least one random access memory array comprising a plurality of memory subarrays. The method comprises receiving a clock signal having alternating first and second transitions thereof and initiating a precharge operation to those ones of the memory subarrays which have been in an active state thereof, substantially upon each of the first transitions of the clock signal.

BRIEF DESCRIPTION OF THE DRAWINGS

The aforementioned and other features and objects of the present invention and the manner of attaining them will become more apparent and the invention itself will be best understood by reference to the following description of a preferred embodiment taken in conjunction with the accompanying drawings, wherein.

DESCRIPTION OF A REPRESENTATIVE EMBODIMENT

Figure 1:
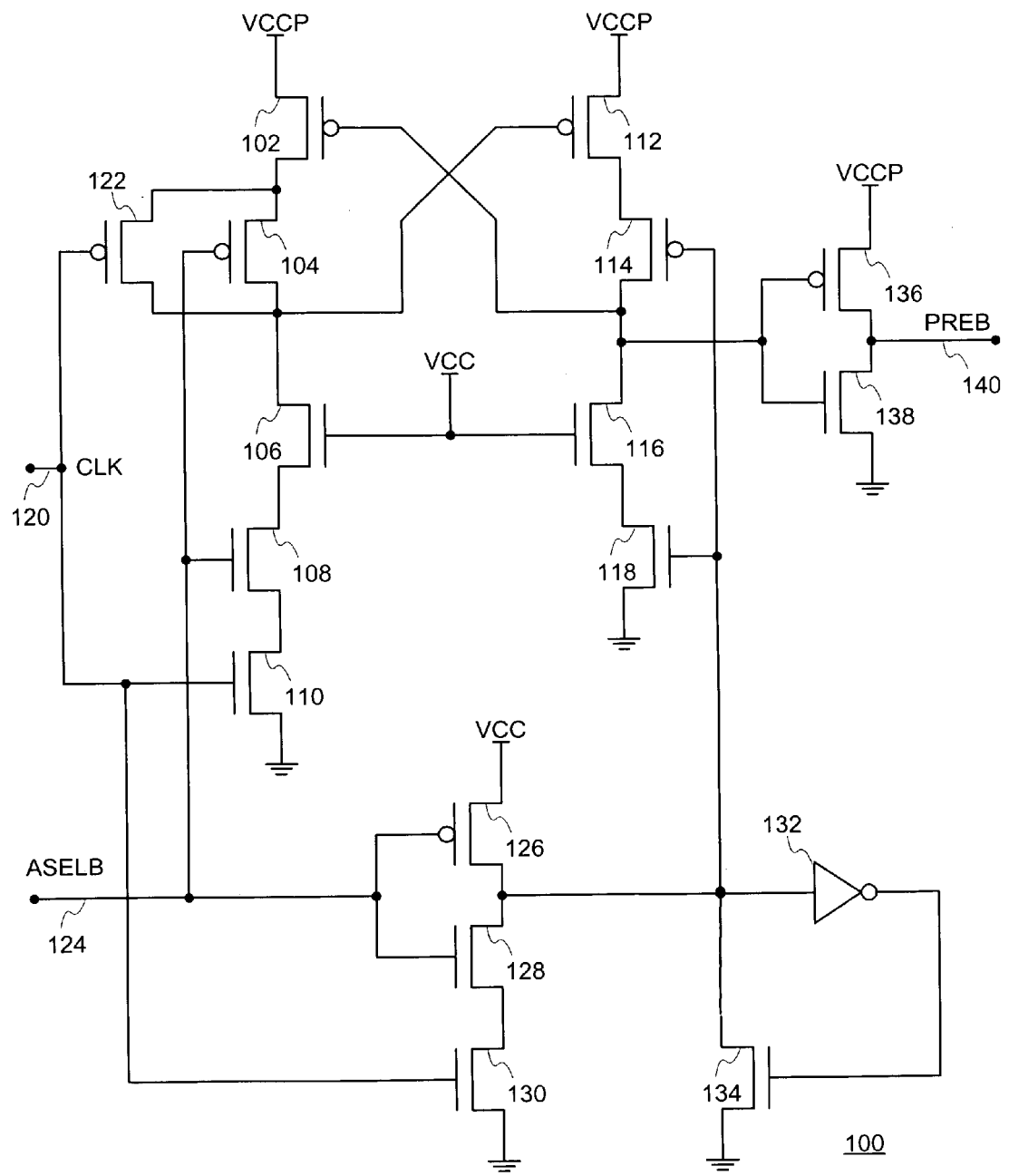
FIG. 1 is a schematic diagram of an exemplary main precharge clock (precharge clock 0 bar [POB]) generator for possible use in implementation of the clock signal initiated precharge technique for active memory subarrays of the present invention.

With reference now to FIG. 1, a schematic diagram of an exemplary main precharge clock (precharge clock 0 bar [POB]) generator 100 is shown for possible use in the implementation of the clock signal initiated precharge technique for active memory subarrays of the present invention. The POB generator 100 comprises series connected P-channel transistors 102 and 104 further in series with N-channel transistors 106, 108 and 110 coupled between a boosted supply voltage source (VCCP) and a reference voltage level of circuit ground. Similarly, series connected P-channel transistors 112 and 114 are connected in series with N-channel transistors 116 and 118 between VCCP and circuit ground.

An input clock (CLK) signal on line 120 is applied to the gate terminal of P-channel transistor 122, which is connected in parallel with transistor 104, as well as to the gate terminal of transistor 110. An array select bar (ASELB) signal is supplied on line 124 which is coupled to the common connected gate terminals of series connected P-channel transistor 126 and N-channel transistor 128 which are further connected in series between a supply voltage level (VCC) and circuit ground with N-channel transistor 130. The ASELB signal on line 124 is also furnished to the gate terminals of transistors 104 and 108 while the CLK signal on line 120 is also furnished to the gate terminal of transistor 130.

The gate terminal of transistor 102 is coupled to the drain terminal of transistor 114 while the gate terminal of transistor 112 is cross coupled to the drain terminal of transistor 104. The gate terminals of transistors 106 and 116 are coupled to VCC while the gate terminals of transistors 114 and 118 are coupled to a node defined by the drain terminal of transistor 126. This same node defines an input to an inverter 132 and is coupled to the drain terminal of N-channel transistor 134 which has its source connected to circuit ground. The output of inverter 132 is supplied to the gate terminal of transistor 134.

The drain terminal of transistor 114 is coupled to the input of an inverter comprising P-channel transistor 136 and series connected N-channel transistor 138 coupled between VCCP and circuit ground. The output of the inverter is connected to precharge bar (PREB) line 140.

Figure 2:
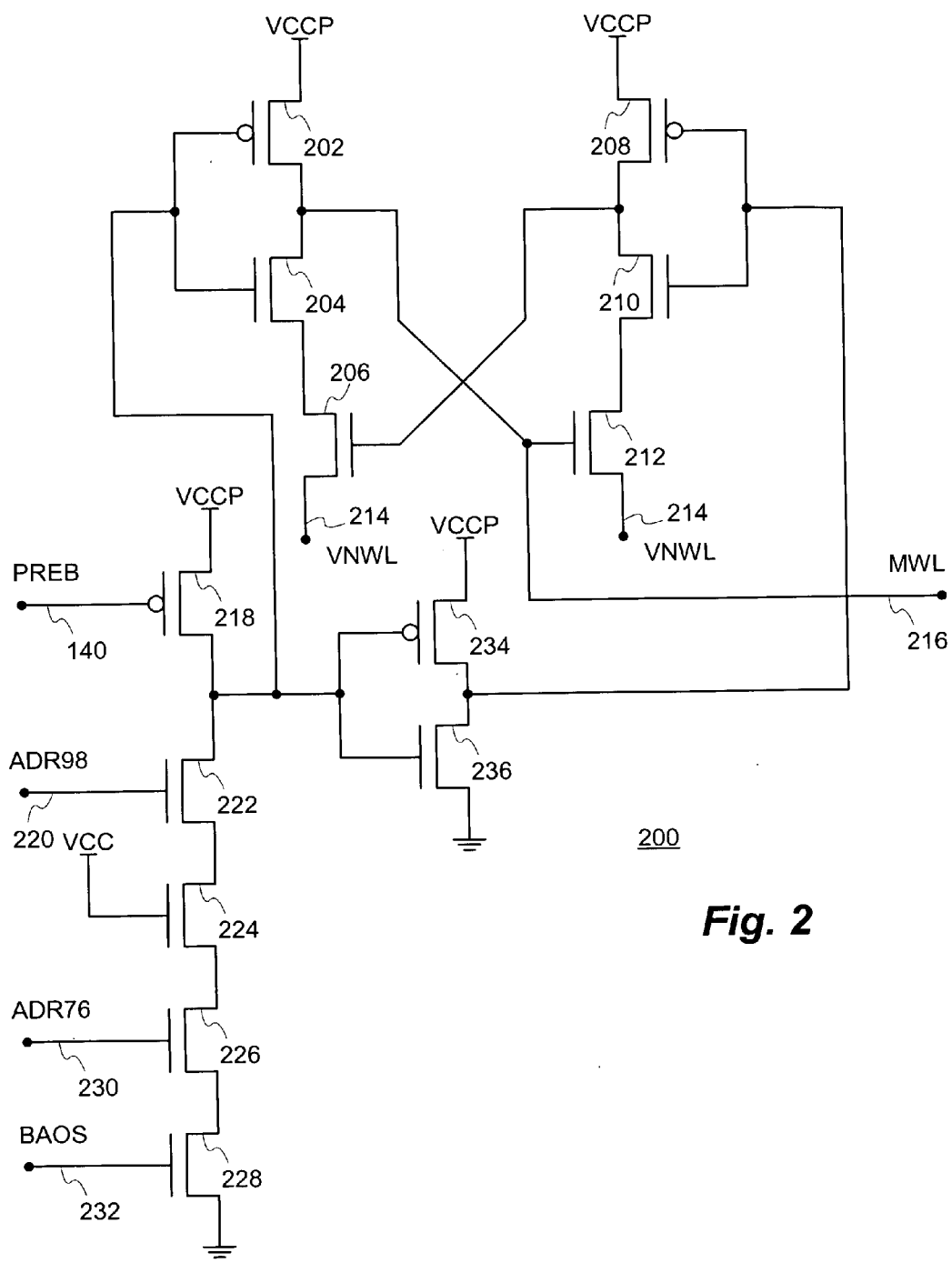
FIG. 2 is another schematic diagram of a representative row decoder circuit for possible use in conjunction with the POB generator of the preceding figure for use in accordance with the technique of the present invention.

With reference additionally now to FIG. 2, a schematic diagram of a representative row decoder circuit 200 is shown for possible use in conjunction with the POB generator 100 of the preceding figure for use in accordance with the technique of the present invention. The row decoder 200 comprises series connected P-channel transistor 202 and N-channel transistors 204 and 206 coupled between VCCP and VNWL 214 where VNWL is a negative supply voltage level that may be used in certain DRAM designs. In like manner, series connected P-channel transistor 208 and N-channel transistors 210 and 212 are also coupled between VCCP and VNWL 214. The drain terminal of transistor 202 is coupled to the gate terminal of transistor 212 and to main word line (MWL) 216 while the drain terminal of transistor 208 is cross coupled to the gate terminal of transistor 214.

P-channel transistor 218, with its source terminal coupled to VCCP, is coupled in series with N-channel transistors 222, 224, 226 and 228 as shown, with the PREB line 140 being coupled to the gate terminal of transistor 218. The common connected gate terminals of transistors 202 and 204 are coupled to the drain terminal of transistor 218 defining an output node of the series connected transistor string. An address 98 (ADR98) signal on line 220 is connected to the gate terminal of transistor 222 while the gate terminal of transistor 224 is connected to VCC. An address 76 (ADR76) signal on line 230 is connected to the gate terminal of transistor 226 while a bank active one shot (BAOS) signal is furnished on line 232 to the gate terminal of transistor 228.

An inverter comprising series connected P-channel transistor 234 and N-channel transistor 236 coupled between VCCP and circuit ground has its input coupled to the output node defined by the drain of transistor 218 and has its output coupled to the common connected gate terminals of transistors 208 and 210.

Figure 3:
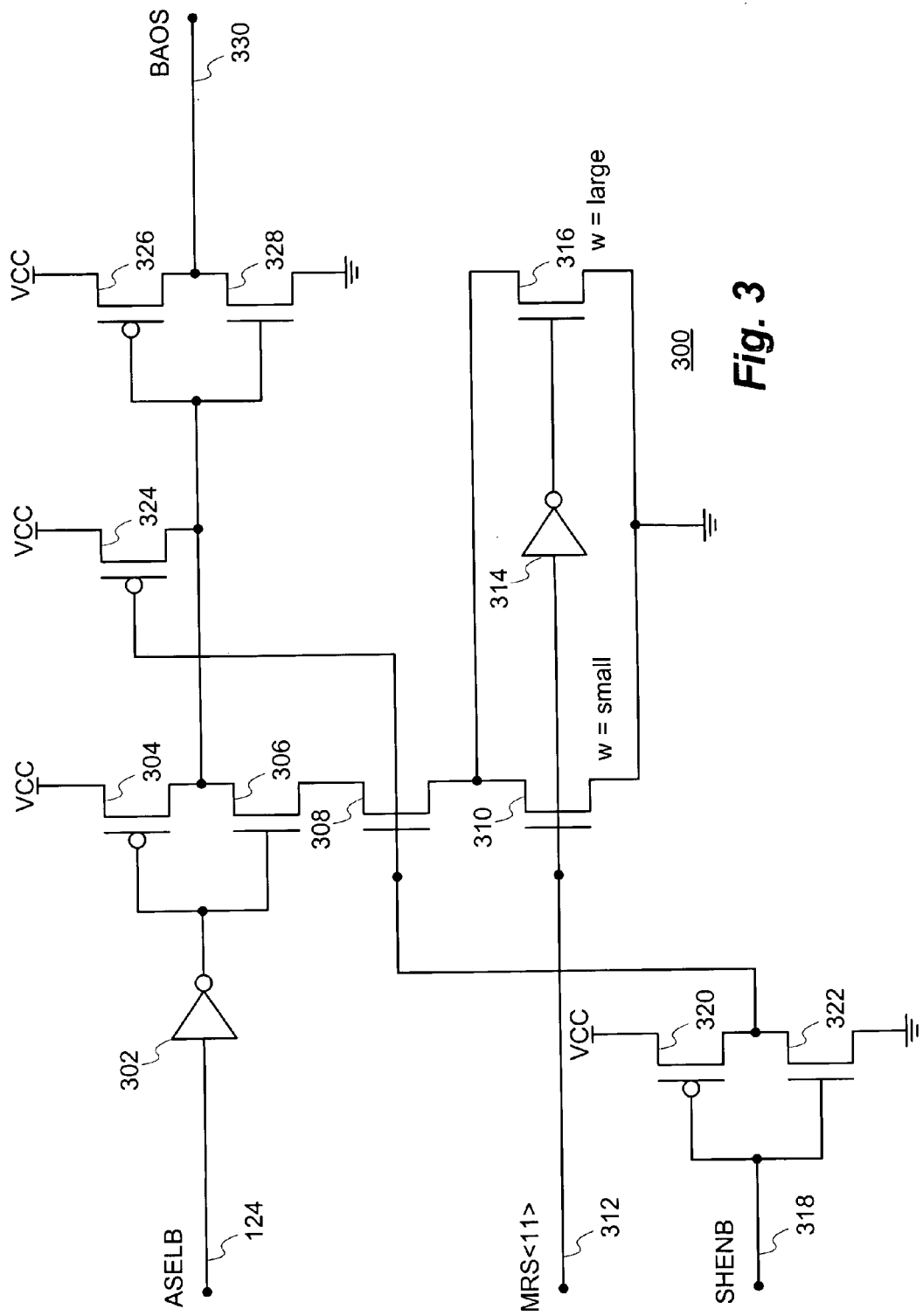
FIG. 3 is a further schematic diagram of an embodiment of a bank active one shot (BAOS) circuit for possible use in implementing the technique of the present invention.

With reference additionally now to FIG. 3, a schematic diagram of an embodiment of a bank active one shot (BAOS) circuit 300 for possible use in implementing the technique of the present invention is shown. The BAOS circuit 300 comprises an inverter 302 which has its input connected to receive the ASELB signal on line 124 and its output connected to the common connected gate terminals of P-channel transistor 302 and N-channel transistor 306 which are further connected in series with N-channel transistors 308 and 310 between VCC and circuit ground. A mode register set bit 11 (MRS<11>) signal on line 312 is supplied to the gate terminal of transistor 310 as well as to the input of an inverter 314 which, in turn, has its output connected to the gate terminal of N-channel transistor 316 which is connected in parallel with transistor 310. In a preferred embodiment, transistor 310 has a relatively small width while transistor 316 has a relatively larger width.

A shorting enable bar (SHENB) signal on line 318 is supplied to the input of an inverter comprising series connected P-channel transistor 320 and N-channel transistor 322 coupled between VCC and circuit ground. Output of the inverter is coupled to the gate terminal of transistor 308 as well as the gate terminal of P-channel transistor 324 coupled between VCC and the drain terminal of transistor 304 which is further connected to the input of an inverter comprising series connected P-channel transistor 326 and N-channel transistor 328. The output of this inverter is coupled to provide a BAOS signal on line 330.

Figure 4:
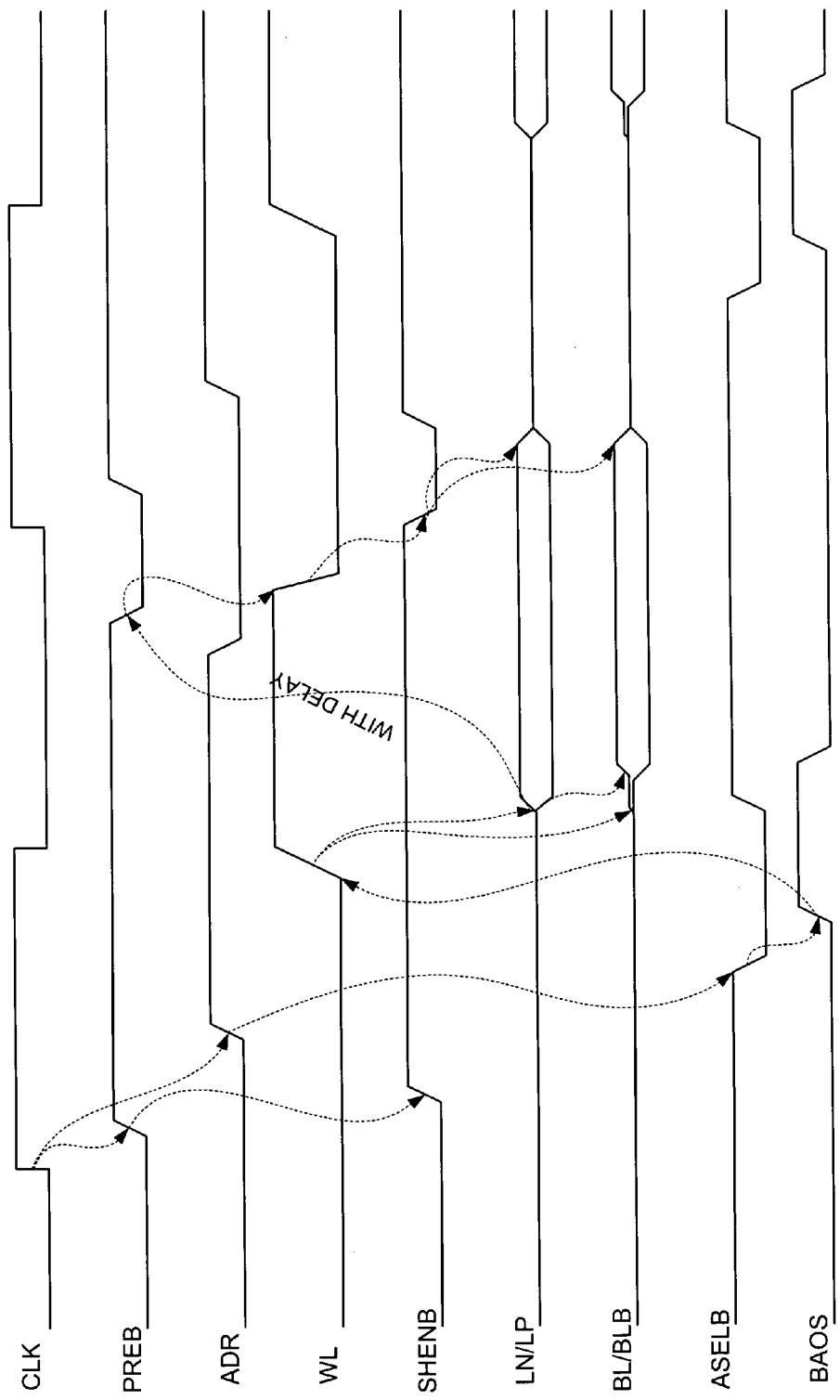
FIG. 4 is a timing diagram for a conventional memory subarray precharge approach wherein the subarrays are made ready on the rising edge of the clock, which then starts an active cycle.

With reference additionally now to FIG. 4, a timing diagram for a conventional memory subarray precharge approach is shown wherein the subarrays are made ready on the rising edge of the clock, which then starts an active cycle. Particularly illustrated are the clock (CLK), precharge bar (PREB), address (ADR), word line (WL), shorting enable bar (SHENB), latch N-channel/latch P-channel (LN/LP; the respective common connections in complementary metal oxide semiconductor (CMOS) sense amplifiers comprising cross-coupled inverters), bit line/bit line bar (BL/BLB), array select bar (ASELB) and a bank active one shot (BAOS) signal.

In a conventional DRAM precharge approach, the first thing the rising edge of the clock does, if a "read" or a "write" command is detected, is to turn off the precharge function by sending the PREB signal "high". Some delay later, due to overall propagation delay and address predecoding, the internal address signals "ADR" go valid. Eventually, a word line (WL) is selected and a memory cell can be accessed.

When all the DRAM functions are to be performed within a single clock cycle, a timer is required to start the precharge portion of control. This time is critical since it is directly related to the speed of the memory and to the refresh characteristics of the memory. If the timer is too slow, speed is wasted and, if too fast, then a poor logic "1" level may be written into the memory cell and the refresh operation will then suffer.

Figure 5:
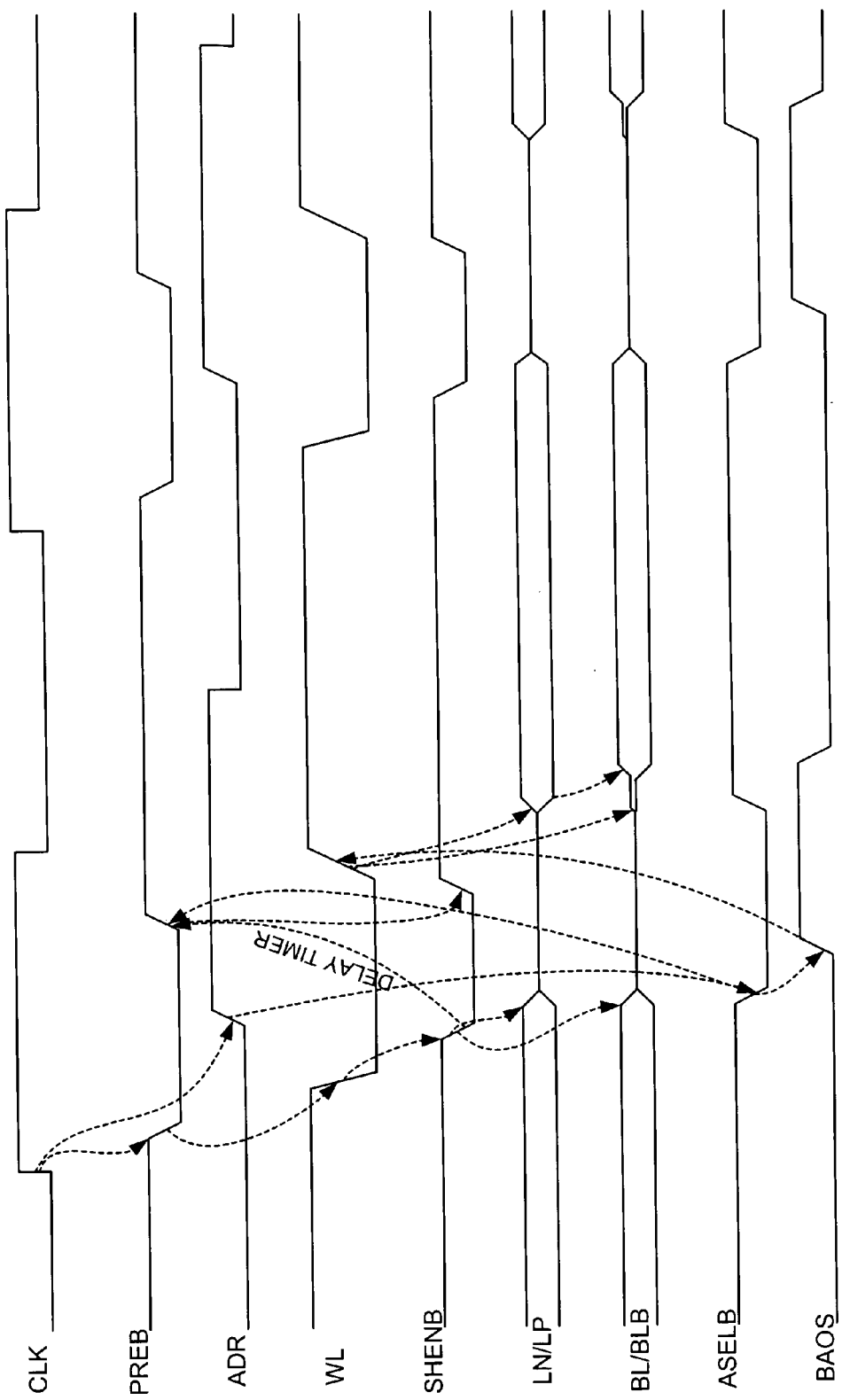
FIG. 5 is a corresponding timing diagram showing the signals of the preceding figure and illustrative of a particular application of the technique of the present invention wherein the rising edge of each clock initiates a precharge to those memory subarrays that were active.

With reference additionally now to FIG. 5 a corresponding timing diagram showing the signals of the preceding figure and illustrative of a particular application of the technique of the present invention is shown wherein the rising edge of each clock initiates a precharge to those memory subarrays that were active.

In accordance with the technique of the present invention, precharge is performed at the beginning of the clock cycle. The first action to take place on any rising clock edge is for the PREB signal to go "low", regardless of the cycle type, e.g. "read", "write" or no operation (NOP). Since the command doesn't need to be decoded, the PREB signal can go "low" very quickly. Then, while the address is being propagated and pre-decoded, precharge can operate in parallel.

Through use of the technique disclosed herein in a representative embodiment, a timer may be used to time the end of precharge, (a relatively short period of time) and therefore, a simpler design to implement than is the case with conventional designs. The rising edge of the next clock signal determines when the active portion of the DRAM operation is complete and, therefore, doesn't need to be timed internally.

It should be noted that the WL "low" time is comparatively longer in the conventional approach illustrated in the preceding figure than is the case with the implementation of the present invention shown. This is effectively wasted time and time that may be better used in accordance with the technique of the present invention to reduce the clock period (i.e. increase speed) or to achieve a better cell restore function. Further, it can be observed that the control line transitions are more closely spaced in this figure than the correspondingly more spread out control lines shown in the preceding figure. This is due to the fact that more operations may be performed in parallel through use of the present invention. Moreover, the present invention may be found to be especially useful in conjunction with DRAM circuits where external precharge commands are not used such as those DRAMs that operate, for example, with an SRAM interface such as cached DRAMs.

In accordance with an implementation of the technique of the present invention as disclosed herein, the positive going transition (i.e. the "rising edge", although the negative-going transition or "falling edge" might also be used in certain other embodiments of the present invention) of each clock initiates a precharge to those memory subarrays that were active. This differs from the conventional approach wherein the subarrays are typically precharged so that they are ready to go on the rising edge of the clock which would then start an active cycle. The longer restore time achieved through the use of the technique of the present invention can be used to ensure the introduction of a better "1" and "0" logic levels into the memory cell and/or to reduce the clock signal period.

Among the advantages or this technique over those previously used are the use of a timing function to determine the end of a precharge operation rather than the end of a cell restore. The former is a shorter time period and, therefore, an easier timer function to implement. Further, faster clock frequencies can be achieved and by initiating each clock cycle with a precharge command, other functions can be performed in parallel with the precharge function. For example, address pre-decoding, data propagation for write functions and, in a particular embodiment of the present invention, the access necessary to determine whether there has been a cache "hit" or "miss". This parallel operation allows for less "dead" time and overall higher memory performance. Still further, the amount of time used to restore voltage into the DRAM array memory cell can be changed with longer or shorter clock periods.

While there have been described above the principles of the present invention in conjunction with specific circuit implementations, it is to be clearly understood that the foregoing description is made only by way of example and not as a limitation to the scope of the invention. Particularly, it is recognized that the teachings of the foregoing disclosure will suggest other modifications to those persons skilled in the relevant art. Such modifications may involve other features which are already known per se and which may be used instead of or in addition to features already described herein. Although claims have been formulated in this application to particular combinations of features, it should be understood that the scope of the disclosure herein also includes any novel feature or any novel combination of features disclosed either explicitly or implicitly or any generalization or modification thereof which would be apparent to persons skilled in the relevant art, whether or not such relates to the same invention as presently claimed in any claim and whether or not it mitigates any or all of the same technical problems as confronted by the present invention. The applicants hereby reserve the right to formulate new claims to such features and/or combinations of such features during the prosecution of the present application or of any further application derived therefrom.

What is claimed is:

1. A method for operation of an integrated circuit device including at least one random access memory array comprising a plurality of memory subarrays, said method comprising:

receiving a clock signal having alternating first and second transitions thereof; and initiating a precharge operation to those ones of said memory subarrays which have been in an active state thereof, substantially upon each of said first transitions of said clock signal, wherein the prechare operation is initiated without regard to a read, write, and NOP cycle type.

2. The method of claim 1 wherein said precharge operation is initiated without requiring predecoding of addresses to particular subarrays of said at least one random access memory array.

3. The method of claim 1 wherein said first and second transitions of said clock signal are positive-going and negative-going transitions respectively.

4. The method of claim 1 further comprising:

terminating said precharge operation at a predetermined time following said initiation of said precharge operation.

5. The method of claim 4 wherein said predetermined time is not dependent upon completion of a cell restore operation in a dynamic random access memory array.

6. The method of claim 4 wherein said predetermined time is established by a timer initiated by said precharge operation.

7. The method of claim 1 wherein completion of an active portion of said memory array operation is indicated by a successive one of said first transitions of said clock signal.

8. The method of claim 1 further comprising:
pre-decoding addresses for said at least one random access memory array while said precharge operation is occurring.

9. The method of claim 1 further comprising:
propagating data for a write operation to said at least one random access memory array while said precharge operation is occurring.

10. The method of claim 1 further comprising:
determining whether at least a portion of data accesses to said memory array are maintained in a cache associated with the said at least one memory array while said precharge operation is occurring.

11. An integrated circuit device including at least one random access memory array comprising a plurality of memory subarrays, said device comprising:
means for receiving a clock signal having alternating first and second transitions thereof; and
means for initiating a precharge operation to those ones of said memory subarrays which have been in an active state thereof, substantially upon each of said first transitions of said clock signal, wherein the precharge operation is initiated without regard to a read, write, and NOP cycle type.

12. The integrated circuit device of claim 11 wherein said precharge operation is initiated without requiring predecoding of addresses to particular subarrays of said at least one random access memory array.

13. The integrated circuit device of claim 11 wherein said first and second transitions of said clock signal are positive-going and negative-going transitions respectively.

14. The integrated circuit device of claim 11 further comprising:
means for terminating said precharge operation at a predetermined time following said initiation of said precharge operation.

15. The integrated circuit device of claim 14 wherein said predetermined time is not dependent upon completion of a cell restore operation in a dynamic random access memory array.

16. The integrated circuit device of claim 14 comprising:
a timer initiated by said precharge operation for establishing said predetermined time.

17. The integrated circuit device of claim 11 wherein completion of an active portion of the said at least one memory array operation is indicated by a successive one of said first transitions of said clock signal.

18. The integrated circuit device of claim 11 further comprising:
means for pre-decoding addresses for said at least one random access memory array while said precharge operation is occurring.

19. The integrated circuit device of claim 11 further comprising:
means for propagating data for a write operation to the said at least one memory array while said precharge operation is occurring.

20. The integrated circuit device of claim 11 further comprising:
means for determining whether at least a portion of data accesses to the said at least one memory array are maintained in a cache associated with said memory array while said precharge operation is occurring.

* * * * *